(12) United States Patent
Huang

(10) Patent No.: US 11,569,375 B2
(45) Date of Patent: Jan. 31, 2023

(54) VERTICAL DIAMOND MOSFET AND METHOD OF MAKING THE SAME

(71) Applicant: HRL Laboratories, LLC, Malibu, CA (US)

(72) Inventor: Biqin Huang, Rancho Palos Verdes, CA (US)

(73) Assignee: HRL LABORATORIES, LLC, Malibu, CA (US)

(*) Notice: Subject to any disclaimer, the term of this patent is extended or adjusted under 35 U.S.C. 154(b) by 0 days.

(21) Appl. No.: 16/851,378

(22) Filed: Apr. 17, 2020

(65) Prior Publication Data

US 2021/0328052 A1    Oct. 21, 2021

(51) Int. Cl.
H01L 29/66    (2006.01)
H01L 29/78    (2006.01)
H01L 29/167   (2006.01)
H01L 29/16    (2006.01)

(52) U.S. Cl.
CPC ...... *H01L 29/7812* (2013.01); *H01L 29/1602* (2013.01); *H01L 29/167* (2013.01); *H01L 29/66045* (2013.01)

(58) Field of Classification Search
CPC combination set(s) only.
See application file for complete search history.

(56) References Cited

U.S. PATENT DOCUMENTS

| | | |
|---|---|---|
| 5,294,814 A | 3/1994 | Das |
| 6,764,884 B1 | 7/2004 | Yu et al. |
| 10,367,086 B2 | 7/2019 | Huang |
| 2005/0221547 A1* | 10/2005 | Yamauchi ....... H01L 21/823487 438/172 |
| 2009/0146186 A1 | 6/2009 | Kub et al. |
| 2010/0078715 A1 | 4/2010 | Lee |
| 2011/0186862 A1 | 8/2011 | Harada et al. |
| 2013/0095623 A1* | 4/2013 | Guo ................ H01L 21/823885 438/268 |

(Continued)

FOREIGN PATENT DOCUMENTS

| | | |
|---|---|---|
| JP | 2006-216716 | 8/2006 |
| WO | 2005-122398 A2 | 12/2005 |
| WO | 2019-191465 A1 | 10/2019 |

OTHER PUBLICATIONS

M. W. Geis, "Diamond transistor performance and fabrication," Proceedings of the IEEE, vol. 79, pp. 669-676, 1991.

(Continued)

*Primary Examiner* — Moin M Rahman
(74) *Attorney, Agent, or Firm* — Ladas & Parry, LLP

(57) ABSTRACT

A vertical field-effect transistor (FET), comprising a first doped region of a first material, said first doped region having a first doping and being formed on a surface of a substrate, a second doped region of said first material, said second doped region having a second doping and being formed on the first doped region, and a third doped region of said first material, said third doped region having a third doping and being formed on the second doped region, wherein the first doped region has a first width along a first direction parallel to said surface of the substrate, the second doped region has a second width along said first direction, the third doped region has a third width along said first direction, the second width being smaller than the first and third widths.

23 Claims, 8 Drawing Sheets

(56) References Cited

U.S. PATENT DOCUMENTS

| | | | |
|---|---|---|---|
| 2013/0187242 | A1 | 7/2013 | Tan et al. |
| 2013/0306983 | A1* | 11/2013 | Nakano ............... H01L 29/1037 |
| | | | 438/270 |
| 2013/0313635 | A1* | 11/2013 | Nakano ............. H01L 29/66727 |
| | | | 257/330 |
| 2015/0228727 | A1 | 8/2015 | Kato et al. |
| 2015/0263173 | A1 | 9/2015 | Lue |
| 2016/0133696 | A1 | 5/2016 | Yin et al. |
| 2017/0222047 | A1 | 8/2017 | Conway et al. |
| 2018/0012967 | A1 | 1/2018 | Kang |
| 2018/0151715 | A1* | 5/2018 | Chowdhury ........ H01L 29/7827 |
| 2020/0006147 | A1* | 1/2020 | Ando ................. H01L 27/0924 |
| 2020/0220008 | A1* | 7/2020 | Takeuchi ............ H01L 29/1608 |
| 2020/0335581 | A1* | 10/2020 | Li ...................... H01L 29/66666 |
| 2021/0104627 | A1* | 4/2021 | Wu ....................... H01L 27/088 |
| 2021/0151595 | A1* | 5/2021 | Park .................... H01L 29/0649 |

OTHER PUBLICATIONS

Guo, J. et al., "MBE-Regrown Ohmics in InAlN HEMTs With a Regrowth Interface Resistance of 0.05Ω·mm." IEEE Electron Device Letters 33, 525-527, (2012).

Biqin Huang et al., "Diamond lateral FinFET with triode like behavior," Scientific Reports 2020 10:2279.

Biqin Huang et al., "Diamond FinFET without Hydrogen Termination," Sci Rep 8, 3063 (2018).

P. Richman, "Modulation of space-charge-limited current flow in insulated-gate field-effect tetrodes," IEEE Transactions on Electron Devices, vol. 16, pp. 759-766, 1969.

B. Wilamowski, "The Punch-Through Transistor with MOS Controled Gate," physica status solidi (a), vol. 79, pp. 631-637, 1983.

J. Nishizawa, T. Terasaki, and J. Shibata, "Field-effect transistor versus analog transistor (static induction transistor)," IEEE Transactions on Electron Devices, vol. 22, pp. 185-197, 1975.

Jean-Pierre Colinge et al, "Nanowire transistors without junctions", Nature Nanotechnology, vol. 5, Mar. 2010, pp. 225-229.

Yinghui Shan et al, "Unipolar accumulation-type transistor configuration implemented using Si nanowires", Applied Physics Letters, 91, 2007, entire document.

Xuejue Huang; Wen-Chin Lee; Kuo, C. ; et al. "Sub-50 nm P-channel FinFET" (PDF). IEEE Transactions on Electron Devices. 48 (5): pp. 880-886. doi:10.1109/16.918235, May 2001.

Chenming Hu; Bokor J.; et al. "FinFET—a self-aligned double-gate MOSFET scalable to 20 nm". IEEE Transactions on Electron Devices. 47 (12): pp. 2320-2325. doi:10.1109/16.887014, Dec. 2000.

Wilson, D. ; Hayhurst, R.; Oblea, A. ; Parke, S. ; Hackler, D. "Flexfet: Independently-Double-Gated SOI Transistor With Variable Vt and 0.5V Operation Achieving Near Ideal Sub-threshold Slope" SOI Conference, 2007 IEEE International Archived Apr. 3, 2015, pp. 147-148.

A. Aleksov, et al. "Diamond field effect transistors-concepts and challenges," Diamond and Related Materials, vol. 12, Issues 3-7, Mar.-Jul. 2003, pp. 391-398.

International Search Report for PCT/US18/34462 dated Sep. 17, 2018.

Written Opinion of the ISA for PCT/US18/34462 dated Sep. 17, 2018.

International Preliminary Report on Patentability for PCT/US18/34462 dated Jul. 12, 2019.

Booske, J. H., "Plasma physics and related challenges of millimeter-wave-to-terahertz and high power microwave generation," Physics of Plasmas, vol. 15, pp. 055502-1 to 055502-16, 2008.

Hiraiwa, A., et al. "Blocking characteristics of diamond junctions with a punch-through design," J. Appl. Phys., vol. 117, pp. 124503-1 to 124503-6, 2015.

Landstrass, M. I., et al. "Hydrogen passivation of electrically active defects in diamond," Appl. Phys. Lett., vol. 55, pp. 1391-1393, 1989.

Gulyaev, Y. V.. et al., "FET on Hydrogenated Diamond Surface," Journal of Communications Technology and Electronics, vol. 59, No. 3, pp. 282-287, 2014.

Russell, S., et al. "RF Operation of Hydrogen-Terminated Diamond Field Effect Transistors: A Comparative Study," IEEE Transactions on Electron Devices, vol. 62, No. 3, pp. 751-756, Mar. 2015.

Hiraiwa, A., et al. "Refractory two-dimensional hole gas on hydrogenated diamond surface," J. Appl. Phys., vol. 112, pp. 124504-1 to 124504-6, 2012.

El-Hajj, H., et al. "Diamond MISFET based on boron delta-doped channel," Diamond and Related Materials, vol. 17, pp. 1259-1263, (2008).

Edgington, R., et al. "Growth and electrical characterisation of δ-doped boron layers on (111) diamond surfaces," J. Appl. Phys., vol. 111, pp. 033710-1 to 033710-7, 2012.

Balmer, R. S. et al. "Transport behavior of holes in boron delta-doped diamond structures," J. Appl. Phys., vol. 113, pp. 033702-1 to 033702-10, 2013.

Kovi, K., et al. "Inversion in Metal-Oxide-Semiconductor Capacitors on Boron-Doped Diamond," IEEE Electron Device Letters, vol. 36, No. 6, pp. 603-605, Jun. 2015.

Matsumoto, T., et al. "Inversion channel diamond metal-oxide-semiconductor field-effect transistor with normally off characteristics." Scientific Reports, vol. 6, pp. 1-6, Aug. 2016.

Colinge, J. P., et al. "Conduction mechanisms in thin-film accumulation-mode SOI p-channel MOSFETs," IEEE Trans. on Electron Devices, vol. 37, No. 3, pp. 718-723, Mar. 1990.

Yokota, Y., et al. "Device Operation of p$^+$-i-p$^+$ Diamond Metal-Insulator-Semiconductor Field-Effect Transistors on Heteroepitaxial Diamond Films Grown on Ir (100)/MgO (100)," New Diamond and Frontier Carbon Technology, vol. 17, No. 4, pp. 211-217, 2007.

Kawakami, N., et al. "Device operation of p-i-p type diamond metal-insulator-semiconductor field effect transistors with sub-micrometer channel," Diamond and Related Materials, vol. 14, pp. 509-513, 2005.

Hisamoto, D. et al. "FinFET—a self-aligned double-gate MOSFET scalable to 20 nm," IEEE Transactions on Electron Devices, vol. 47, No. 12, pp. 2320-2325, Dec. 2000.

Liu, J., et al. "Design and fabrication of high-performance diamond triple-gate field-effect transistors," Scientific Reports, vol. 6, pp. 1-8, Oct. 2016.

Hu, C. C. *Modern Semiconductor Devices for Integrated Circuits*, Pearson, p. 162, 2009.

Rashid, S. J. et al. "Numerical Parameterization of Chemical-Vapor-Deposited (CVD) Single-Crystal Diamond for Device Simulation and Analysis," IEEE Transactions on Electron Devices, vol. 55, No. 10, pp. 2744-2756, Oct. 2008.

Ortiz-Conde, A. et al. "Revisiting MOSFET threshold voltage extraction methods," Microelectronics Reliability, vol. 53, pp. 1-15, 2013.

Office Action (Restriction Requirement) from U.S. Appl. No. 15/896,048 dated Sep. 6, 2018.

Office Action (Ex Parte Quayle Action) from U.S. Appl. No. 15/896,048 dated Jan. 11, 2019.

Notice of Allowance from U.S. Appl. No. 15/896,048 dated Mar. 15, 2019.

Office Action (Restriction Requirement) from U.S. Appl. No. 16/281,727 dated Sep. 17, 2019.

Office Action (Restriction Requirement) from U.S. Appl. No. 16/281,727 dated Nov. 15, 2019.

Office Action (Non-Final Rejection) from U.S. Appl. No. 16/281,727 dated Apr. 3, 2020.

Notice of Allowance from U.S. Appl. No. 16/281,727 dated Sep. 15, 2020.

Written Opinion of the International Searching Authority for PCT/US2020/028845, dated Nov. 6, 2020. Note: This was previously cited in the Information Disclosure Statement (IDS) filed on Dec. 15, 2020. However the Written Opinion filed with this IDS mistakenly did not include pp. 3 and 4 of the Written Opinion dated Nov. 6, 2020. To correct this filing, a full Written Opinion is provided herewith.

Cedric Masante et al., 175V, > 5.4 MV/cm, 50 mΩ.cm$^2$ at 250° C. Diamond MOSFET and its reverse conduction, May 23, 2019,

(56) References Cited

OTHER PUBLICATIONS

Proceedings of the 31st International Symposium on Power Semiconductor Devices & ICs, [retrieved on Jul. 20, 2020], Retrieved from <IEEE, https://ieeexplore.ieee.org/document/8757645><https://doi.org/10.1109/ISPSD.2019.8757645>; entire document which includes pp. 1/2, 2/2, and pp. 151-154.

International Search Report for PCT/US2020/028845, dated Nov. 6, 2020.

Written Opinion of the International Searching Authority for PCT/US2020/028845, dated Nov. 6, 2020.

* cited by examiner

Growth Mask Patterning

Diamond Growth

Source Metal Formation

Growth Mask Removal

Gate Dielectric Growth

Gate Metal Deposition

Gate Metal Formation

Drain Metal Formation

Starting substrate

Growth mask etch back p channel etch (f) p++ regrowth and metal formation

Growth mask deposition

Growth mark removal

Growth mask planarization

Gate dielectric deposition

Gate metal deposition

Gate metal patterning

Drain contact formation

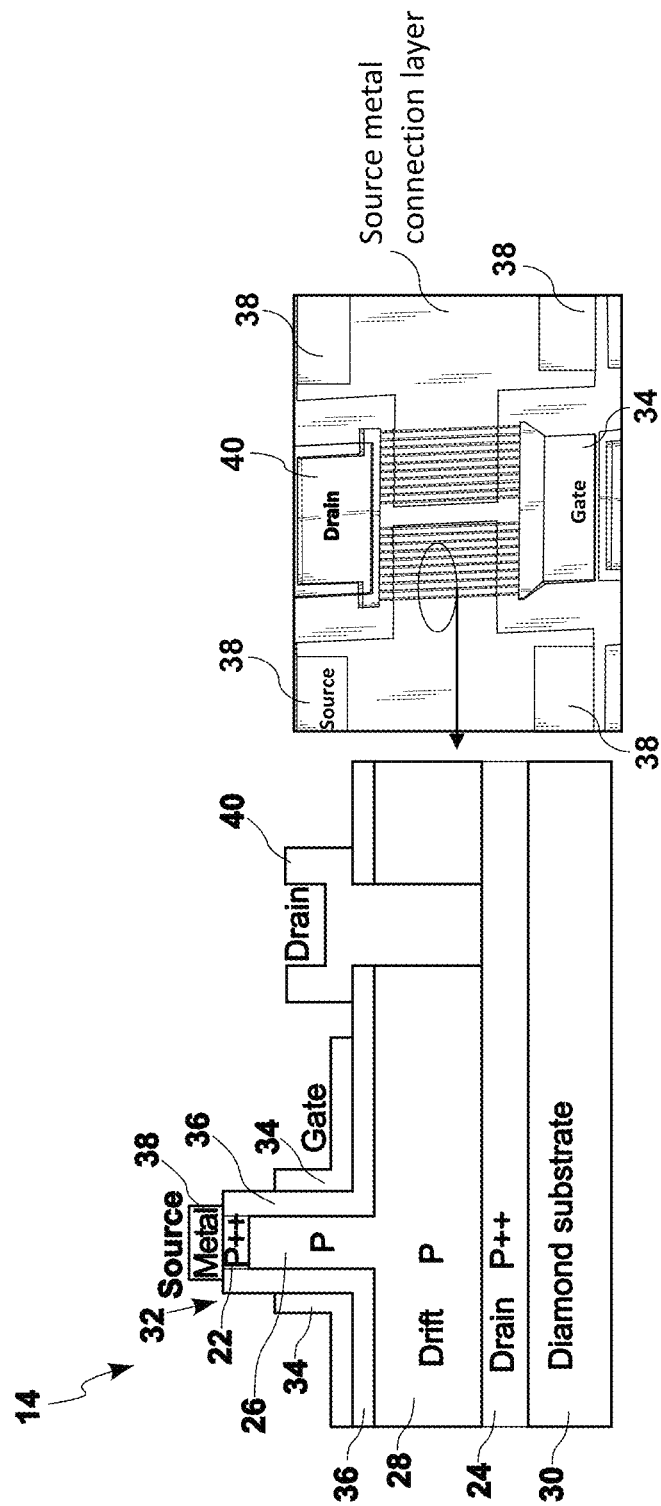

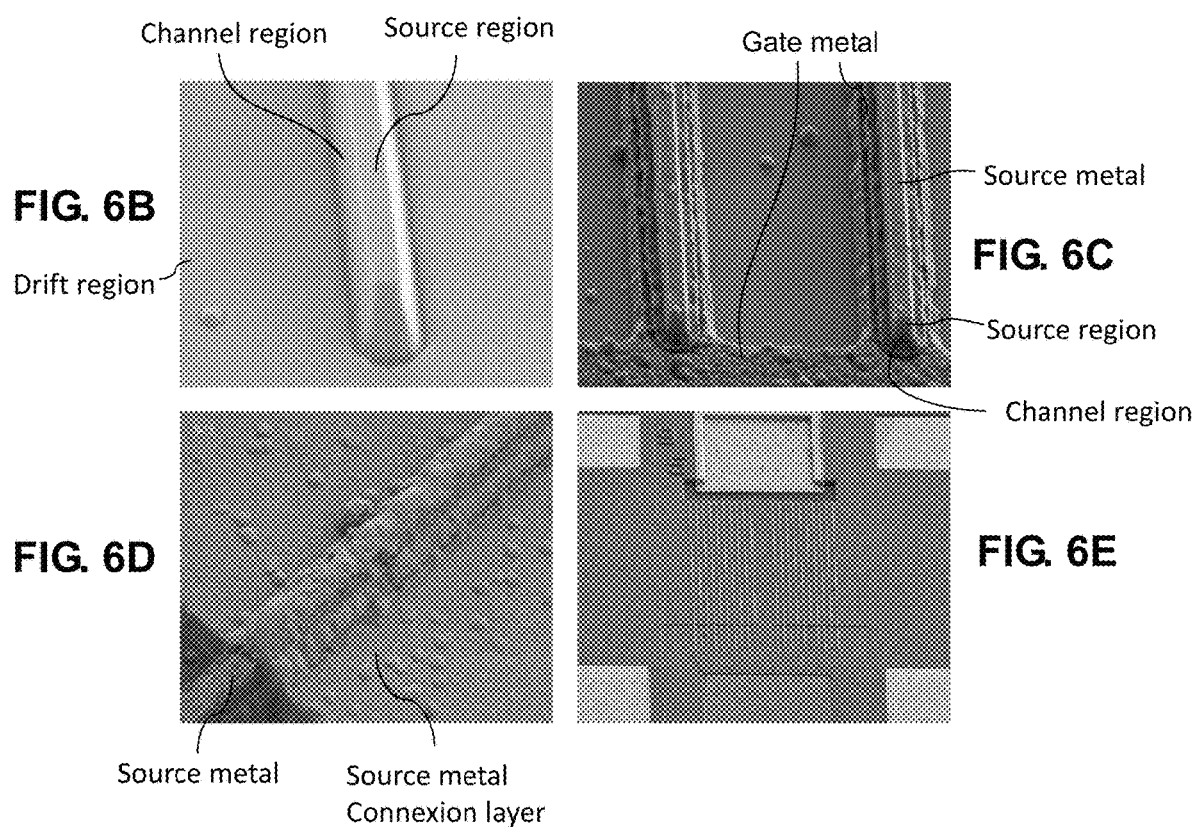

US 11,569,375 B2

VERTICAL DIAMOND MOSFET AND METHOD OF MAKING THE SAME

TECHNICAL FIELD

This presentation relates to a vertical diamond transistor such as, for example, a metal-oxide-semiconductor diamond field-effect transistor (MOSFET) and a process for making the same.

BACKGROUND

This presentation is related to a series of publications.

M. W. Geis, "Diamond transistor performance and fabrication," Proceedings of the IEEE, vol. 79, pp. 669-676, 1991. This paper describes a vertical device made using a conventional microfabrication process without utilizing a diamond regrowth process, where the size of the source contact is limited by the size of the channel.

U.S. Pat. No. 5,294,814, Vertical Diamond Field Effect Transistor. The device is formed on a non-diamond substrate without utilizing a diamond regrowth process.

US20180151715A1, Diamond Based Current Aperture Vertical Transistor and Methods of Making And Using the same. The device structure uses a p/n junction different from the transistor presented herein.

"Diamond lateral finFET with triode-like behavior", by Biqin Huang, Xiwei Bai, Stephen K. Lam & Samuel J. Kim; Scientific Reports volume 10, Article number: 2279 (2020), which is hereby incorporated by reference.

SUMMARY

This presentation relates to a vertical diamond transistor and to a process for making the vertical diamond transistor, which can include a regrowth process. The vertical diamond transistor can comprise a relatively small/narrow channel region and a relatively large/wide source/drain contact area.

A vertical diamond transistor according to an embodiment of this presentation can utilize the large breakdown field in diamond, thereby providing a significant power performance for various applications ranging from, for example, low radio frequency (RF) to millimeter (mm) wave electronics.

A vertical diamond transistor according to an embodiment of this presentation can benefit a wide range of applications in RF electronics. For example, the vertical diamond transistor can be a diamond RF transistor Substrate punch through is known to occur in lateral transistors during operation. Substrate punch through does not occur during operation of a vertical diamond transistor according to an embodiment of this presentation because of the physical separation between the source and drain regions, thereby enabling the vertical diamond transistor with a much higher breakdown voltage than that of a lateral transistor.

A process for making the vertical diamond transistor can comprise a process of diamond regrowth and gate formation.

The process for making a vertical diamond transistor according to embodiments of this presentation can comprise a diamond regrowth process to make the diamond vertical transistor with, for example, a single type of dopants.

According to an embodiment of this presentation, the transistor can comprise n-type dopants, wherein the transistor does not comprise p-type dopants.

According to an embodiment of this presentation, the transistor can comprise p-type dopants, wherein the transistor does not comprise n-type dopants.

The vertical diamond transistor can be a vertical diamond MOSFET.

A p/n junction is not necessarily required for the operation of the vertical diamond transistor. Therefore, according to an embodiment of this presentation, the vertical diamond transistor does not comprise a p/n junction.

The process for making a transistor according to an embodiment of this presentation can comprise forming the vertical diamond transistor with a relatively narrow channel region and with relatively large contact areas for both drain/source regions.

The structure of a transistor according to embodiments of this presentation can enable the scaling of the transistor without compromising the contact resistance significantly, thereby facilitating a high-speed and high-power operation of the transistor.

Embodiments of this presentation relate to a vertical metal-oxide-semiconductor field-effect transistor (MOSFET), comprising: a first doped region of a first material, said first doped region having a first doping and being formed on a surface of a substrate; a second doped region of said first material, said second doped region having a second doping and being formed on the first doped region; and a third doped region of said first material, said third doped region having a third doping and being formed on the second doped region; wherein: the first doped region has a first width along a first direction parallel to said surface of the substrate; the second doped region has a second width along said first direction; the third doped region has a third width along said first direction; the second width being smaller than the first and third widths.

According to embodiments of this presentation, the vertical MOSFET comprises a fourth doped region of said first material, having a fourth doping and formed between the first and second doped regions; a drain metal layer in contact with a portion of the first doped region; and a source metal layer in contact with the third doped region, wherein each of the drain metal layer and the source metal layer has, in said first direction, a contact width larger than the second width.

According to embodiments of this presentation, the vertical MOSFET comprises: a fourth doped region of said first material, having a fourth doping and formed between the second and third doped regions; a source metal layer in contact with a portion of the first doped region; and a drain metal layer in contact with the third doped region, wherein each of the drain metal layer and the source metal layer has, in said first direction, a contact width larger than the second width.

According to embodiments of this presentation, the second doped region has side walls, along a second direction perpendicular to the surface of the substrate; and a gate dielectric covers said side walls.

According to embodiments of this presentation, a gate electrode covers said at least a portion of said gate dielectric along said side walls.

According to embodiments of this presentation, the substrate is made out of said first material. According to embodiments of this presentation, the substrate can be a diamond substrate. According to embodiments of this presentation, the substrate can be a single crystalline diamond substrate.

According to embodiments of this presentation, the first doping has a concentration larger than the second doping; the third doping having a concentration larger than said second doping.

According to embodiments of this presentation, the first material comprises diamond.

According to embodiments of this presentation, the first, second, and third dopings are p-type doping. According to embodiments of this presentation, if the first, second, and third dopings are p-type doping, the fourth doping is p-type doping.

According to embodiments of this presentation, the first, second, and third dopings are n-type doping. According to embodiments of this presentation, if the first, second, and third dopings are n-type doping, the fourth doping is n-type doping.

Embodiments of this presentation also relate to a vertical metal-oxide-semiconductor field-effect transistor (MOSFET), comprising: a first doped region of a first material, said first doped region having a first doping and being formed on a substrate; a second doped region of said first material, said second doped region having a second doping and being formed on the first doped region; a third doped region of said first material, said third doped region having a third doping and being formed on the second doped region, thereby forming a contact surface between said second doped region and said third doped region; wherein: the first doped region has a first width along a first direction parallel to said contact surface between said second doped region and said third doped region; the second doped region has a second width along said first direction; and the third doped region has a third width along said first direction; the second width being smaller than the first and third widths.

Embodiments of this presentation also relate to a vertical metal-oxide-semiconductor field-effect transistor (MOSFET), comprising: a first doped region of a first material, said first doped region having a first doping and being formed on a substrate; a second doped region of said first material, said second doped region having a second doping and being formed on the first doped region, thereby forming a first contact area between said first doped region and said second doped region; and a third doped region of said first material, said third doped region having a third doping and being formed on the second doped region, thereby forming a second contact area between said second doped region and said third doped region; wherein the second contact area is smaller than the first contact area.

Embodiments of this presentation also relate to a vertical metal-oxide-semiconductor field-effect transistor (MOSFET), comprising: a first doped region of a first material, said first doped region having a first doping and being formed on a substrate; a second doped region of said first material, said second doped region having a second doping and being formed on the first doped region; a third doped region of said first material, said third doped region having a third doping and being formed on the second doped region; wherein during operation: the first doped region has a first current density; the second doped region has a second current density; and the third doped region has a third current density; the second current density being larger than the first and third current densities.

Embodiments of this presentation also relate to method of making a vertical metal-oxide-semiconductor field-effect transistor (MOSFET), comprising: providing a first doped region of a first material, said first doped region having a first doping and being formed on a surface of a substrate; providing a second doped region of said first material, said second doped region having a second doping and being formed on the first doped region; and providing a third doped region of said first material, said third doped region having a third doping and being formed on the second doped region; wherein: the first doped region has a first width along a first direction parallel to said surface of the substrate; the second doped region has a second width along said first direction; the third doped region has a third width along said first direction; the second width being smaller than the first and third widths.

According to embodiments of this presentation, the method further comprises: providing a fourth doped region of said first material, having a fourth doping and formed between the first and second doped regions; providing a drain metal layer in contact with a portion of the first doped region; and providing a source metal layer in contact with the third doped region, wherein each of the drain metal layer and the source metal layer has, in said first direction, a contact width larger than the second width.

According to embodiments of this presentation, the method further comprises: providing a fourth doped region of said first material, having a fourth doping and formed between the second and third doped regions; providing a source metal layer in contact with a portion of the first doped region; and providing a drain metal layer in contact with the third doped region, wherein each of the drain metal layer and the source metal layer has, in said first direction, a contact width larger than the second width.

According to embodiments of this presentation, the second doped region has side walls, along a second direction perpendicular to the surface of the substrate; the method comprising covering said side walls with a gate dielectric and covering at least a portion of said gate dielectric with a gate electrode.

According to embodiments of this presentation, said substrate is made out of said first material.

According to embodiments of this presentation, said first doping has a concentration larger than said second doping; the third doping having a concentration larger than said second doping.

According to embodiments of this presentation, said first material comprises diamond.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 5 shows a cross-sectional view of a vertical diamond transistor.

FIGS. 6A-6E show images of a prototype of a vertical diamond transistor as shown in FIG. 5.

DETAILED DESCRIPTION

Figure 1A:
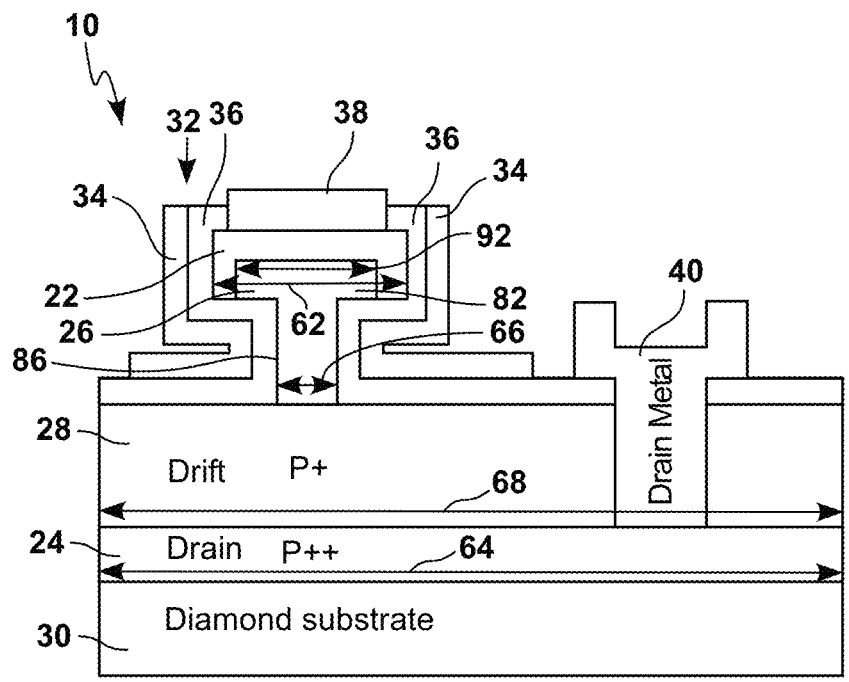
FIG. 1A shows a cross-sectional view of a transistor, according to an embodiment of this presentation.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the claimed invention.

Diamond based electronics have been attractive for decades due to the intrinsic characteristics of diamond material. Enabled by the notable material properties of diamond, which include a breakdown field of greater than 10 MV/cm, electron and hole mobility of greater than 2000 $cm^2$/V/s, and thermal conductivity of greater than 20 W/cm/K, a diamond transistor can significantly improve the power performance of solid state RF electronics, benefiting various RF and power electronic systems such as phased array radars, electrical automobiles, and power grids. Simplified thermal management and size, weight, and power improvements enabled by diamond technology can potentially facilitate the application of high-power solid-state RF systems on mobile platforms such as satellites and drones.

Despite diamond's notable material properties, diamond has not competed well with other wide band gap materials due to several limitations. For example, and until recently, the material availability of diamond was insufficient and generally, the size of a typical diamond sample was smaller than desired.

To utilize the notable material properties of diamond, a lateral fin-based diamond transistor (i.e. diamond lateral FinFET) was presented in U.S. Pat. No. 10,367,086 B2 issued on Jul. 30, 2019, which is hereby incorporated by reference. Although a lateral FinFET can address the lack of channel isolation at high voltages by introducing a fin-based channel with an additional buffer layer, the source and drain regions of the lateral FinFET may be electrically connected together through the substrate or through a buffer layer. By carefully designing the lateral FinFET, the breakdown voltage of the lateral FinFET can be improved. However, the risk of punching through in the substrate or punching through in the buffer layer underneath the channel may still be present during operation.

In a vertical diamond transistor according to an embodiment of this presentation, the source and drain regions can be electrically connected only through the channel region so that when the channel region is pinched off, the source and drain are not electrically connected. According to an embodiment of this presentation, the source and drain regions can be connected only through the channel region so that when the channel region is pinched off, the source and drain do not have any other physical path to induce the device breakdown. Hence, the breakdown voltage (e.g., greater than 1000V) of the vertical transistor can be higher than that of a lateral FinFET.

According to an embodiment of this presentation, when the channel region is pinched off, the transistor may not comprise any current paths between the source and drain regions.

FIG. 1A shows a cross-sectional view of a vertical diamond transistor 10 according to an embodiment of this presentation, comprising a first doped region 24 of a first material, said first doped region 24 having a first doping and being formed on a surface of a substrate 30. According to an embodiment of this presentation, the transistor 10 can further comprise a second doped region 26 of said first material, said second doped region 26 having a second doping and being formed above the first doped region 24. According to an embodiment of this presentation, the transistor 10 can further comprise a third doped region 22 of said first material, said third doped region 22 having a third doping and being formed above the second doped region 26.

According to an embodiment of this presentation, the first doped region 24 can have a first width 64 along a first direction parallel to the surface of the substrate 30. According to an embodiment of this presentation, the second doped region 26 can have a second width 66 along said first direction and the third doped region 22 can have a third width 62 along said first direction. According to an embodiment of this presentation, the second width 66 can be smaller than the first 64 and third 62 widths.

According to an embodiment of this presentation, said first material can comprise diamond.

In this presentation, the third doped region 22 can be a source region and the third doped region 22 can be referred to as the source region 22. Similarly, the first doped region 24 can then be operated as a drain region, and the first doped region 24 can be referred to as the drain region 24.

An optional fourth doped region 28, acting as a drift region can be arranged between the drain region 24 and the channel region 26, with a fourth doping concentration of a same dopant as the drain and channel regions, smaller than the drain region 24 and higher than the channel region 26. The fourth region 28 can have a fourth width 68 larger than the second width 66.

The fourth region 28 can be used to support a higher breakdown voltage of the transistor. For example, breakdown voltage can be mainly determined by the gate to drain region separation distance, and the gate to drain separation distance can essentially be the thickness of the fourth region 28 (i.e. the drift region thickness). The breakdown voltage can be roughly proportional to the thickness of the fourth region 28 (i.e. the drift region 28), and increasing this thickness can increase the breakdown voltage. Since an ideal diamond layer can provide a breakdown field of approximately 10MV/cm, a transistor having a diamond drift region thickness of 1µm can have a breakdown voltage of approximately 1000V, according to an embodiment of this presentation.

Alternatively, though not shown, the third doped region 22 can be operated as a drain region and be referred to as the drain region 22, and the first doped region 24 can be operated as a source region and referred to as the source region 24. A fourth doped region (not shown) acting as a drift region (to e.g. increase the breakdown voltage of the transistor) can then be arranged between the drain region 22 and the channel region 26, with a fourth doping concentration of a same dopant as the drain and channel regions, smaller than the drain region 22 and higher than the channel region 26; and with a fourth width 68 larger than the second width 66.

So as not to obscure this presentation, the third doped region 22 will hereafter be referred to as the source region 22 and the first doped region 24 will be referred to as the drain region 24.

According to an embodiment of this presentation, the second doped region 26 can be a lightly doped diamond channel region 26, and the source region 22 can be a heavily doped diamond source region 22. According to an embodiment of this presentation, a heavily doped region can be a region that has a doping concentration of greater than $10^{19}$ $cm^{-3}$. According to an embodiment of this presentation, a lightly doped region can be a region that has a doping concentration of less than $10^{19}$ $cm^{-3}$. According to an embodiment of this presentation, the doping concentration in the source region 22, the drain region 24, the channel region 26, and/or the drift region 28 can be independent of the doping type (the doping type can be n-type or p-type) in these regions. According to an embodiment of this presentation, the doping concentration in these regions can be mainly determined by the application of the transistor, for example, the desired gate threshold voltage, breakdown voltage, etc. According to an embodiment of this presentation, a heavily doped region or material can be a region or material that is doped sufficiently high (e.g., greater than $10^{19}$ cm$^{-3}$ doping concentration) so that the region or material is more electrically conductive. According to an embodiment of this presentation, a lightly doped region or material can be a region or material that is doped at a lower concentration than the same region or material when heavily doped. According to an embodiment of this presentation, a lightly doped region or material can be an undoped region or material. An undoped region or material can include a region or material that is not intentionally doped, for example, a region or material with intrinsic doping. According to embodiments of this presentation, the transistor can operate as normally off or normally on, depending on the thickness of the channel and of the gate dielectric, which will determine if the transistor will be normally on or off. A transistor according to embodiments of this presentation is similar to a junction FET, in that there is no particular two-dimensional hole gas (2DHG) as in other thin conducting layer devices because according to embodiments of this disclosure the hole carriers distribute through the whole channel structure. It can be noted however that when a transistor according to embodiments of this presentation operates in the accumulation regime, there is a hole gas on the interface between diamond and gate dielectric.

According to an embodiment of this presentation, and as shown, the transistor 10 can further comprise a first metal layer 38 in contact with the source region 22. The first metal layer 38 can form an ohmic metal contact with source region 22.

When the first metal layer 38 is operated as a source metal contact, the first metal layer 38 can be referred to as the source metal layer 38, according to an embodiment of this presentation.

As outlined above, a drift region 28 can be arranged between the drain region and the channel region. According to an embodiment of this presentation, the doping of the drift region is heavier than the doping of the channel region but lighter than the doping of the drain region. According to an embodiment of this presentation, the drift region can have a doping concentration in the range from $10^{17}$/cm$^3$ to $10^{19}$/cm$^3$.

According to an embodiment of this presentation, the transistor 10 can be a vertical diamond MOSFET enabled by a regrowth process, according to an embodiment of this presentation. According to an embodiment of this presentation, the regrowth process can refer to a process comprising growing a diamond region. According to an embodiment of this presentation, the regrowth process can comprise (e.g., selectively) growing the drain region 24, the channel region 26, the source region 22, and/or the drift region 28. Selectively growing can comprise forming a mask to define a region where diamond is to be grown. According to an embodiment, the regrowth process can be referred to as a regrowth fabrication process. See Guo, J. et al. MBE-Regrown Ohmics in InAlN HEMTs With a Regrowth Interface Resistance of 0.050Ω·mm. IEEE Electron Device Letters 33, 525-527, doi:10.1109/LED.2012.2186116 (2012) which is hereby incorporated by reference. Also Diamond lateral FinFET with triode like behavior Biqin Huang, Xiwei Bai, Stephen K. Lam & Samuel J. Kim, Scientific Reports 2020 10:2279 which is hereby incorporated by reference.

For example, A (100) 10×10-mm undoped diamond substrate with an epitaxially grown p− layer can be used. The p+ layer can be regrown with microwave plasma CVD using a patterned SiO2 mask. Ti/Pt/Au can be evaporated to form a good ohmic contact with 525° C. annealing in argon gas after regrowth and mask removal. 45 nm SiO2 gate dielectric can be deposited by atomic layer deposition at 200° C. To conformably wrap the gate around the sidewalls of the fins, Al metal can be sputtered with a photoresist in place, then the metal can be lifted off. Finally, ohmic contact pads can be opened with wet etching.

According to an embodiment of this presentation, the channel region 26 can comprise first 82 and second 84 portions. According to an embodiment of this presentation, second portion 84 of the channel region 26 can comprise a fin-like channel region 86. However, the channel region 26 can have any shape or any horizontal cross-section shape, as long as the second width 66 of the channel region is smaller than the first width 64 of the drain region and/or of the source region in a cross section along a plane perpendicular to the surface of the substrate. For example, the channel region can have a circular cross section, a ring cross section, a rectangular cross section, or an ellipsoid cross section (not shown) in a plane parallel to the surface of the substrate (horizontal cross-section).

According to an embodiment of this presentation, and as illustrated in FIG. 1A, a gate structure 32 can be formed on a sidewall of the channel region 26. According to an embodiment of this presentation the gate structure 32 can comprise a gate dielectric 36 on the sidewall of the channel region 26 (i.e. walls of the Channel region 26 perpendicular to the surface of the substrate), and a gate electrode 34 on the dielectric layer 36. As illustrated, the gate structure 32 can be an all-around gate structure 32 formed on at least two sidewalls of the channel region 36. As illustrated, the gate dielectric 36 can be a dielectric layer 36, according to an embodiment of this presentation. According to an embodiment of this presentation, the method of forming the gate electrode 34 can determine the variation in thickness of the gate electrode 34 on different regions of the transistor. For example, if the gate electrode 34 is deposited via atomic layer deposition, the thickness of the gate electrode 34 around the channel region 26 and the thickness of the gate electrode 34 on other regions can be the same. If another method is used, for example, if the gate electrode 34 is deposited by sputtering, the variation in the thickness of the gate electrode 34 on different regions of the transistor can be relatively larger, and in particular, the thicknesses of the gate electrode 34 on different regions can be different.

The source region 22 and the drain region 24 can comprise heavily doped p-type diamond to reduce the ohmic contact resistance. The drift region 28 can comprise lightly doped p-type diamond. According to an embodiment of this presentation, the channel region 28 can comprise more lightly doped p-type diamond.

The dopant concentration in the drift region 28 can be the same as that in the channel region 26, and this can depend on the design of the transistor 10 for certain applications. For example, the dopant concentration in the drift region 28 can be the same as that in the channel region 26 to reduce the channel to drain resistance. The drift region 28 can have a gradient doping profile and its doping profile can be determined by the design of the transistor 10. For example, the gradient doping profile of the drift region 28 can be a linear gradient doping profile, wherein the doping in the drift region 28 varies (e.g., increases) in a third direction from the channel region 26 to the drain region 24. According to an embodiment of this presentation, the doping in the drift region 28 can increase linearly and/or increase stepwise in the third direction. According to an embodiment of this presentation, the doping in the drift region 28 can increase from $10^{17}/cm^3$ at a first side closest to the channel region to $10^{20}/cm^3$ or greater at a second side closest to the drain region 24. According to an embodiment of this presentation, the doping in the drift region 28 can vary from having the same doping concentration as the channel region 26 at the first side closest to the channel region to having the same doping concentration as the drain region 24 at the second side closest to the drain region.

According to an embodiment of this presentation, the source region 22 (which is here shown on the channel region 26) and a first (top) portion 82 of the channel region 26 can respectively have a third width 62 and a fifth width 92, each larger than the second width 66 of a second (bottom) portion 84 of the channel region 26. According to an embodiment, the third width 62 and the fifth width 92 can be the same. Giving such a shape to the channel layer is enabled by a process detailed hereafter. The source region 22 and the first (top) portion 82 of the channel region 26 can be wider than the second (bottom) portion 84 of the channel region to so that the contact resistance between the source region 22 and the channel region 26 is reduced or minimized. Depending on the method used to form the channel region 26 (e.g. dry etching), the channel region 26 can be tapered such that it has a larger cross-section at its top 82 than at its bottom 84. For example, the source region 22 and the channel region 26 can be widened to increase the contact area between the source region 22 and the channel region 26, thereby reducing or minimizing the contact resistance between the source region 22 and the channel region 26. Similarly, the contact area between the first metal layer 38 and the source region 22 can be increased (i.e. be given a width larger than the second width 66) to reduce or minimize the contact resistance between the first metal layer 38 and the source region 22.

In order to effectively modulate the channel region 26 during operation, a width of the channel region 26 (e.g. the second width 66, of the second portion 84 of the channel region 26) is preferably small (i.e. smaller than the third width 62). To reduce the device threshold, the second 66 width of the channel region 26 and the doping concentration in the channel region 26 may have to be reduced accordingly. See for example the reference "Diamond FinFET without Hydrogen Termination", by Huang, B., Bai, X., Lam, S. K. et al. Sci Rep 8, 3063 (2018). https://doi.org/10.1038/s41598-018-20803-5

According to an embodiment of this presentation, the top contact area can be decoupled from the channel width scaling by having the above-described two-width channel layer, hence maintaining a desired contact resistance while allowing to have a narrow channel layer in contact with the drift region.

According to an embodiment of this presentation, and as illustrated in FIG. 1A, the source region 22 can optionally wrap around (i.e. extend downward along vertical sides of the top portion 82 of the channel region 26) the first portion 82 of the T-shaped channel region 26. According to an embodiment of this presentation, the first portion 82 of a T-shaped channel region 26 as illustrated can be a top portion 82 of the channel region 26, and the second portion 84 can be a bottom portion 84 of the channel region 26. According to an embodiment of this presentation, the first portion 82 of the channel region 26 can be on the second portion 84. According to an embodiment of this presentation, the second portion 84 of the channel region 26 can be formed on (i.e. in contact with) the drift region 28.

According to an embodiment of this presentation, the second portion 84 of the channel region 26 can be a major portion of the channel region 26 (i.e. represent more than 50% of the length of the channel), and the first portion 82 of the channel region 26 can be a minor portion of the channel region 26 (i.e. represent less than 50% of the length of the channel). According to an embodiment of this presentation, the second portion 84 of the channel region 26 can be a fin-like channel.

According to an embodiment of this presentation, the second portion 84 of the channel region 26 can be gated by gate 34. According to an embodiment of this presentation, the sidewalls (at least one sidewall) of the second portion 84 of the channel region 26 can be gated by gate 34. According to an embodiment of this presentation, the narrow width 66 of at least the second portion 84 of channel 26 allows to effectively modulate the channel (e.g. a p-channel if the channel is p-doped) while the wider width 92 of the first portion 82 of the channel allows minimizing the contact resistance between channel and source. It is to be noted that even if the channel comprises no wider first portion 82, the source region on top of the channel is wider than the channel, which allows having a size of contact surface between the source and source metal contact that does not depend from the second width 66 of the channel, thus allowing minimizing the contact resistance without impairing the modulation capabilities of the gate electrode 34 on the channel region 26.

According to an embodiment of this presentation, and as illustrated, the transistor 10 can further comprise a substrate 30, and the drain region 24 can be formed on the substrate 30. According to an embodiment of this presentation, the substrate 30 can be a diamond substrate 30.

According to an embodiment of this presentation, and as shown, the transistor 10 can further comprise a second metal region or layer 40 on the drain region 24. When the second metal layer 40 is operated as a drain metal layer, the second metal layer 40 can be referred to as the drain metal layer 40, according to an embodiment of this presentation.

Figure 1B:
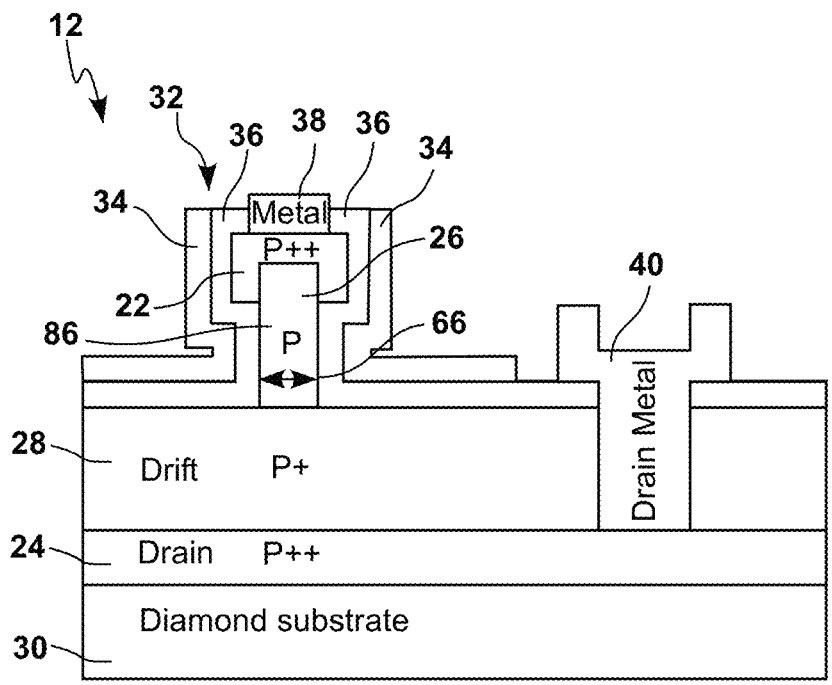
FIG. 1B shows a cross-sectional view of a transistor, according to an embodiment of this presentation.

FIG. 1B shows a cross-sectional view of a vertical diamond transistor 12, according to an embodiment of this presentation, which can be the same as the transistor 10 except that the first 82 and second 84 portions of the channel region 26 of the transistor 12 can have the same width 66 or approximately the same width. For example, the first 82 and second 84 portions of the channel region 26 can have a uniform cross-section (second 66) width along a plane perpendicular to the surface (e.g. top surface) of the substrate 30. According to an embodiment of this presentation, the channel region 26 can comprise a fin-like channel region 86. As shown, the first portion 82 of the channel region 26 can be a top portion of the channel region 26 and the source region 22 can wrap around the top portion of the channel region 26. According to an embodiment of this presentation, at least a portion of the sidewalls of the channel region 26 can be gated by gate electrode 34.

FIGS. 2A-2H illustrate a process for making the vertical diamond transistor 10 shown in FIG. 1A, according to an embodiment of this presentation, comprising providing a diamond substrate 30. According to an embodiment of this presentation, providing the diamond substrate 30 can comprise preparing the diamond substrate 30. According to an embodiment of this presentation, the diamond substrate 30 can be a single crystalline diamond substrate 30.

Figure 2A:
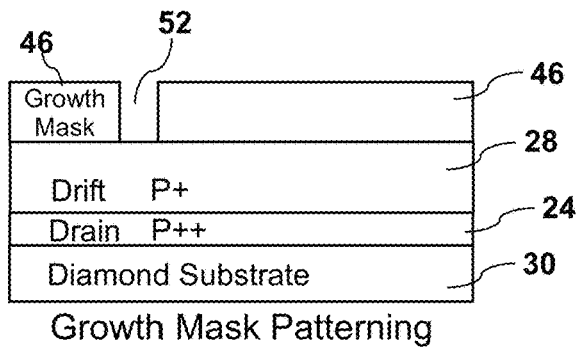
FIGS. 2A to 2H show cross-sectional views of the transistor shown in FIG. 1A during a process for making the transistor, according to an embodiment of this presentation.

According to an embodiment of this presentation, and as illustrated in FIG. 2A, the process can further comprise forming a drain region 24 on the diamond substrate 30, and forming a drift region 28 on the drain region 24. According to an embodiment of this presentation, forming the drain region 24 can comprise depositing the drain region 24 on the diamond substrate 30. According to an embodiment of this presentation, forming the drift region 28 can comprise depositing the drift region 28 on the drain region 24. According to an embodiment of this presentation, the drain region 24 and drift region 28 can respectively be a drain layer 24 and drift layer 28. According to an embodiment of this presentation, the drain layer 24 and the drift layer 28 can be grown layers such as, for example, epitaxially grown layers.

According to an embodiment of this presentation, the drift region can have a constant doping profile. However, in other embodiments, the doping profile of the drift region can be a non-constant doping profile, and for example vary along a direction perpendicular to the surfaces of contact between the regions. For example, the doping profile of the drift region can be custom designed and optimized for certain applications.

According to an embodiment of this presentation, and as illustrated in FIG. 2A, the process can further comprise forming a mask 46 on the drift region 28. According to an embodiment of this presentation, the mask 46 can be a dielectric mask 46. According to an embodiment of this presentation, an opening in the mask 46 and a portion of the drift region 28 can define a cavity 52 in which the channel region 26 can be formed. According to an embodiment of this presentation, the mask 46 can be a "hard" mask 46. According to an embodiment of this presentation, the mask 46 can be formed through deposition and dry etch processes. If the mask is a hard mask 46, the hard mask 46 can be a SiO$_2$ mask such as, for example, a SiO$_2$ mask layer. The hard mask can alternatively be a metal mask such as, for example, a metal mask layer. The metal mask layer can for example be a layer of tungsten (W) or titanium tungsten (TiW). Preferably, the composition of the mask is predetermined so that the mask 46 can support a diamond growth process performed at a temperature greater than 700° C. without for example contaminating the growth system, which can be defined by the drift region 28, the drain region 24, and the substrate 30.

Figure 2B:
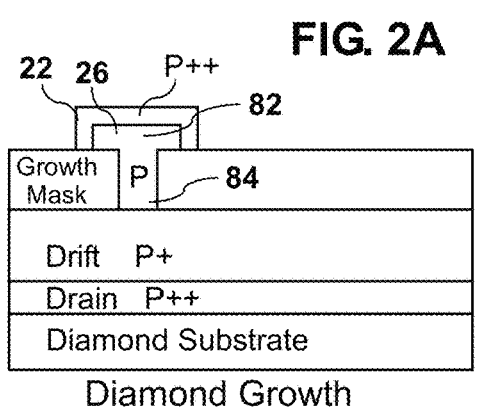

According to an embodiment of this presentation and as illustrated in FIG. 2B, the process can further comprise forming the channel region 26 in the cavity 52 defined by the opening in the mask 46 and the portion of the drift region 28. According to an embodiment of this presentation, forming the channel region 26 can comprise growing the channel region 26 in the cavity 52. If the channel region 26 is grown, the cavity 52 can be referred to as a growth region. According to an embodiment of this presentation, if the channel region is grown, the channel region 26 can be referred to as a "regrown" channel region 26 (as opposed to an originally "grown" substrate/drain/drift regions). According to an embodiment of this presentation, if the process comprises using the mask 46 to grow the channel region 26, growing the channel region 26 can be referred to as a "masked diamond regrowth process".

According to an embodiment of this presentation, if the channel comprises distinct first and second regions as detailed above, forming the channel region 26 can comprise first forming the second portion 84 of the channel region 26 in the cavity 52. According to an embodiment of this presentation, forming the second portion 84 of the channel region 26 can comprise filling the cavity 52 with the second portion 84 of the channel region 26. According to an embodiment of this presentation, forming the channel region can then comprise forming the first portion 82 of the channel region 26, partly on the second portion 84 of the channel region 26 and partly on the mask 46. The first portion 82 of the channel region 26 can be formed on portions of the mask 46 so that the first portion 82 is wider than the second portion 84 of the channel region 26. According to an embodiment of this presentation, the first 82 and second 84 portions of the channel can form a T-shaped channel region 26.

According to an embodiment of this presentation and as illustrated in FIG. 2B, the process can further comprise forming a source region 22 on the channel region 26. Forming the source region 22 can comprise growing the source region 22 on the channel region 26. According to an embodiment of this presentation, said forming the source region can comprise forming the source region 22 partly on channel region 26 and partly on the mask 46.

According to an embodiment of this presentation, forming the channel region 26, the drift region 28, the source region 22, and/or the drain region 24 can comprise depositing the channel region 26, the drift region 28, the source region 22, and/or the drain region 24. According to an embodiment of this presentation, the channel region 26, the drift region 28, the source region 22, and/or the drain region 24, can be deposited via chemical vapor deposition, and for example, microwave plasma enhanced chemical vapor deposition (MWPECVD) of doped diamond. The MWPECVD can be performed with a MWPECVD of diamond growth tool. However, other embodiments can comprise depositing the channel region 26, the drift region 28, the source region 22, and/or the drain region 24 using other diamond growth or deposition processes.

If the first 82 and second 84 portions of the channel region 26 are grown, the growth time of the first portion 82 of the channel region 26 can essentially determine the size (for example the width 92) of the first portion 82 of the channel region 26. Due to for example a lateral overgrowth of the first portion 82 of the channel region 26 during growing the channel region 26, the width 92 of the first portion 82 of the channel region 26 can be controlled by controlling the growth time of the first portion 82 of the channel region 26. For example, the growth time of the first portion 82 of the channel region 26 can be increased to widen the first portion 82 of the channel region. According to an embodiment of this presentation, the source region 22 can be grown to wrap around the widened first portion 82 of the channel region 26. The lateral overgrowth of the channel region 26 can be preferable since this overgrowth can result in a larger source region 26, and therefore a larger contact area between the source region 26 and a first metal layer 38 (detailed hereafter). With this additional degree of freedom, the ohmic contact to the top can be optimized to increase the device speed and power.

Figure 2C:
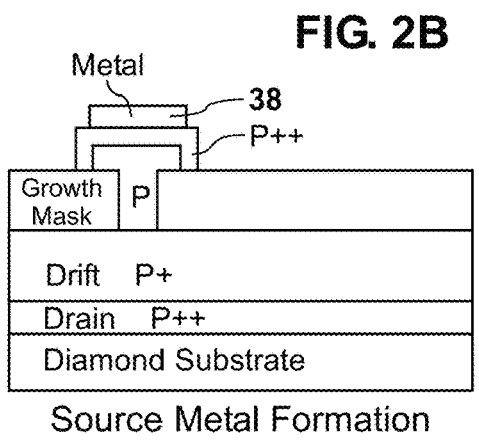

According to an embodiment of this presentation and as illustrated in FIG. 2C, the process can further comprise forming the first metal layer/contact 38 on the source region 22. The first metal layer 38 can be deposited using a lithography process and a metallization process after forming the source region 22.

Figure 2D:
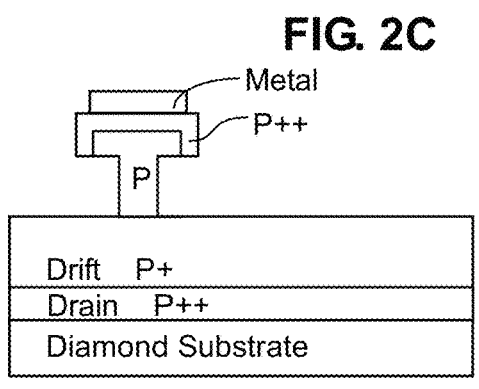

According to an embodiment of this presentation and as illustrated in FIG. 2D, the process can further comprise removing the mask 46 from the channel region 26, the source region 22, and/or the drift region 28. The mask 46 can be removed by wet etching and/or dry etching the mask 46.

According to an embodiment of this presentation, the channel region 26 can form a T-shaped structure (as exemplified in FIG. 1A). According to an embodiment of this presentation, the channel region 26 and the source region 22 can together form a T-shaped structure (as exemplified in FIG. 1B).

Figure 2E:
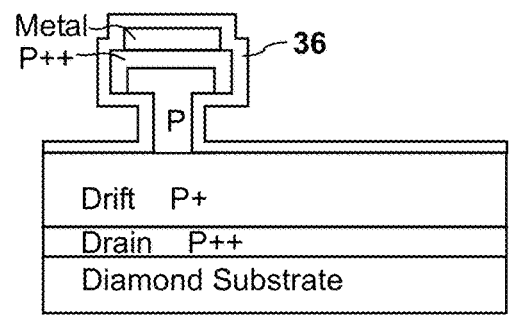

According to an embodiment of this presentation and as illustrated in FIG. 2E, the process can further comprise forming a dielectric layer 36 on at least portions of lateral (i.e. perpendicular to the surface of the substrate) walls of the channel region 26. If the channel region 26 comprises first 82 and second portions 84, the process can comprise forming the dielectric layer 36 along the walls of at least the second portion 84 of the channel region 26. If the channel region 26 comprises first 82 and second 84 portions, the process can further comprise forming the dielectric layer 36 around the walls of the first channel region 26. According to an embodiment of this presentation, the dielectric layer 36 can completely cover the channel region 26.

According to an embodiment of this presentation, forming the dielectric layer can comprise forming the dielectric layer 36 on at least lateral walls of the source region 22 and eventually on lateral walls of the first metal layer 38. The dielectric layer 36 can also eventually cover the drift region 28 parallel to the substrate surface. According to an embodiment of this presentation, the dielectric layer 36 can be a conformal dielectric layer 36. According to an embodiment of this presentation, the dielectric layer 36 can be formed using a conformal dielectric growth process to form a dielectric layer 36 that is, for example, thin.

According to an embodiment of this presentation, if the source region 22, the channel region 26, the drift region 28, and the first metal layer 38 form a non-planar structure, the dielectric layer 36 preferably is a conformal dielectric layer 36 formed, for example, using a conformal dielectric growth process. The dielectric layer 36 can comprise $SiO_2$, $Al_2O_3$, $HfO_2$, SiN, $TiO_2$, SiON, $Ta_2O_5$ and/or other high k dielectric materials, according to an embodiment of this presentation. According to an embodiment of this presentation, the dielectric layer 36 can be a $SiO_2$ dielectric layer, an $Al_2O_3$ dielectric layer, a $HfO_2$ dielectric layer, or a high k dielectric layer. According to an embodiment of this presentation, the dielectric layer 36 can be deposited via atomic layer deposition (ALD); however, in other embodiments, the dielectric layer 36 can be deposited via sputtering or via a plasma enhanced chemical vapor deposition (PECVD) process. A top portion of dielectric layer 36 can be removed after forming dielectric layer 36 for accessing at least a portion of metal layer 38.

Figure 2F:
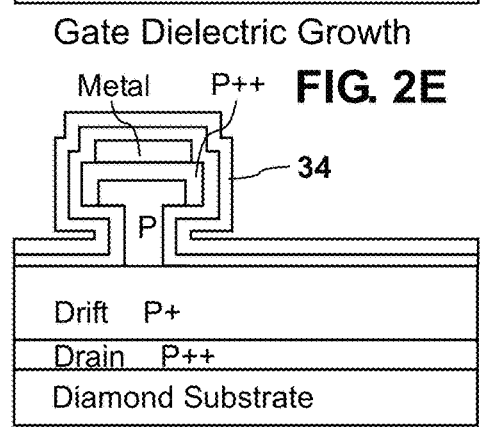

According to an embodiment of this presentation and as illustrated in FIG. 2F, the process can further comprise forming a conductive gate layer or gate electrode 34 on at least a portion of the dielectric layer 36. Forming the gate electrode 34 can comprise forming the gate electrode 34 on at least a portion of the dielectric layer 36 that was formed around at least the channel region 26. Forming the gate electrode 34 can comprise depositing the gate electrode 34 via a conformal deposition process. According to an embodiment of this presentation, forming the gate electrode 34 can comprise depositing the gate electrode 34 via atomic layer deposition (ALD), via sputtering, and/or via a plasma enhanced chemical vapor deposition (PECVD) process. The gate electrode 34 can comprise aluminum (Al), titanium (Ti), tungsten (W), titanium tungsten (TiW), gold (Au), titanium/gold (Ti/Au) deposited in that order, and/or another metal. According to an embodiment of this presentation, the gate electrode 34 can be an aluminum gate electrode, a titanium gate electrode, a tungsten gate electrode, a titanium tungsten gate electrode, a gold gate electrode, and/or a titanium/gold gate electrode.

Figure 2G:
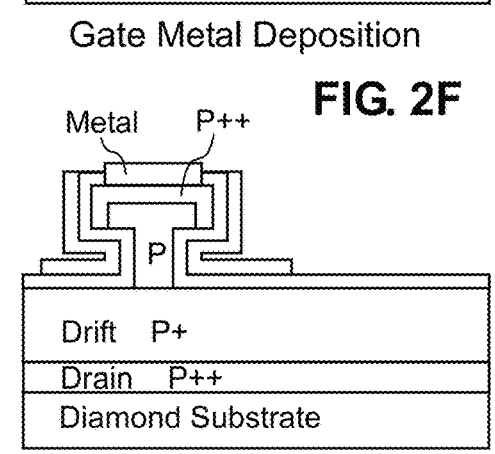

According to an embodiment of this presentation and as illustrated in FIG. 2G, forming the gate electrode 34 can further comprise patterning the gate electrode 34 so that the first metal layer 38 is exposed and isolated from gate electrode 34 by portions of the dielectric layer 36.

Exposing the first metal layer 38 can comprise removing a portion of the gate electrode 34 and of the dielectric layer 36 that was formed on the first metal layer 38. According to an embodiment of this presentation, exposing the first metal layer 38 can comprise removing a portion of the gate electrode 34 that was formed on the portion of the dielectric layer 36 that was formed on the first metal layer 38.

Figure 2H:
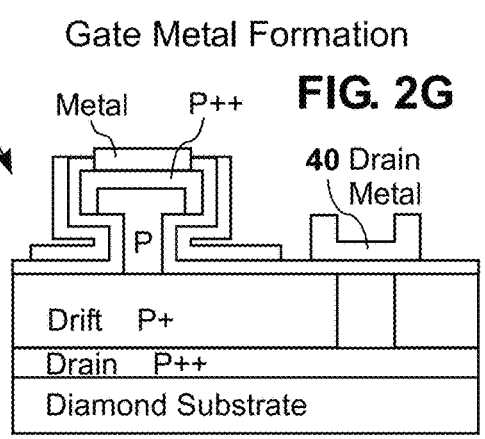

According to an embodiment of this presentation and as illustrated in FIG. 2H, the process can further comprise forming a second metal layer 40 on the drain region 24. According to an embodiment of this presentation, forming the second metal layer 40 can comprise etching (e.g. dry etching) the drift region 28 to form a through-cavity (not labelled) down to drain region 24 in the drift region 28, and then forming the second metal layer 40 in contact with drain 28 in the cavity of the drift region 28. According to an embodiment, the lateral walls of the cavity that is to be filled by metal 40 can be lined with a dielectric (not shown). The process illustrated in FIG. 2 is an example of making a vertical diamond transistor 10. It is expected that the process shown in FIG. 2 can be changed or modified to form the same transistor 10 with a T-shaped channel region 26 and source region 22.

Figure 3:
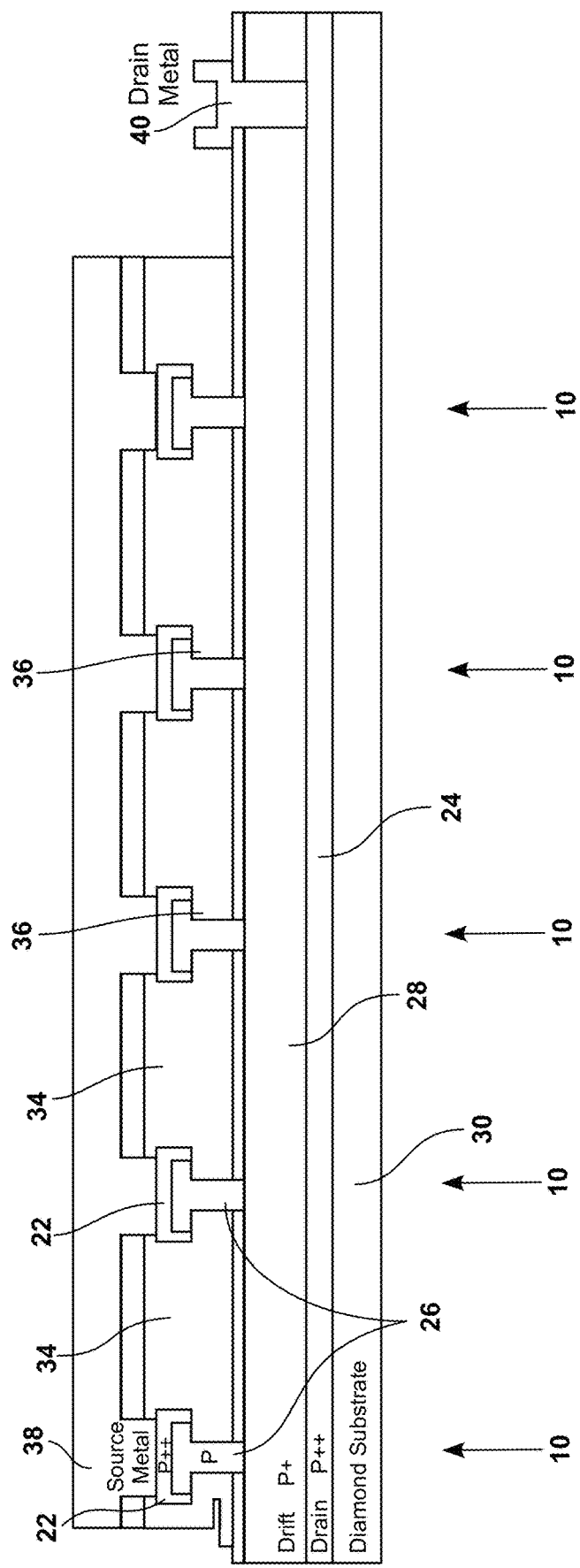
FIG. 3 shows a cross-sectional view of an array of transistors, according to an embodiment of this presentation.

FIG. 3 shows an array 20 of vertical diamond MOSFETs 10 according to an embodiment of this presentation, comprising a diamond substrate 30, a drain region 24 on the substrate 30, a drift region 28 on the drain region 24, and a plurality of channel regions 26 on the drift region 28. The array 20 can further comprise source regions 22 on the channel regions 26, dielectric layers 36 on the lateral walls of channel regions 26, and gate electrodes 34 on the dielectric layers 36.

According to an embodiment of this presentation, the gate electrodes 34 can be formed between the channel regions 26 of the transistors 10 in the array 20. According to an embodiment of this presentation, the gate electrodes 34 can be formed by forming gate metal layers (not labeled) on the dielectric layers 36 of the transistors 10. The gate metal layers can be conformal gate metal layers deposited, for example, using a conformal deposition process. After forming the gate metal layers, empty spaces between the channel regions 26 can be filled with a gate metal to form the gate electrodes 34, as illustrated in FIG. 3, for example using a plating or sputtering process.

As shown in FIG. 3, the array 20 of transistors 10 can be connected in parallel, according to an embodiment of this presentation. Although not shown, in other embodiments, the array 20 of transistors 10 can be connected in series. For example, the devices can be isolated from each other, then connected in series through metal interconnect. Alternatively, according to embodiments of this presentation, all the transistors can share a same drain; the source of the transistors being separated.

According to an embodiment of this presentation, electrodes such as metal-filled gate electrodes 34 can remove heat from the other elements (e.g. the first metal layer 38, the second metal layer 40, the channel regions 26, the drift region 28, the drain region 24, and/or the source regions 22) of the array 20 during operation. According to an embodiment of this presentation, such metal-filled gate electrodes 34 can also function as a heat spreader during operation.

As shown in FIG. 3, the source regions 22 can be electrically interconnected by the first metal layer 38, according to an embodiment of this presentation. According to an embodiment of this presentation, the first metal layer 38 can be a single first metal layer 38. The gate electrodes 34 can be electrically interconnected, although this is not shown in FIG. 3. According to an embodiment of this presentation, the first metal layer 38 and the gate electrodes 34 can each be formed using a lithography and metallization process.

According to an embodiment of this presentation, the drain region 24 can be a single drain region 24, the drift region 28 can be a single drift region 28, and/or the second metal layer 40 can be a single second metal layer 40. Alternatively, a plurality of metal contacts 40 can be provided. Alternatively, the metal contacts 40 can pass through the substrate 30 to come into contact with the bottom surface of the drain 24.

Figure 4A:
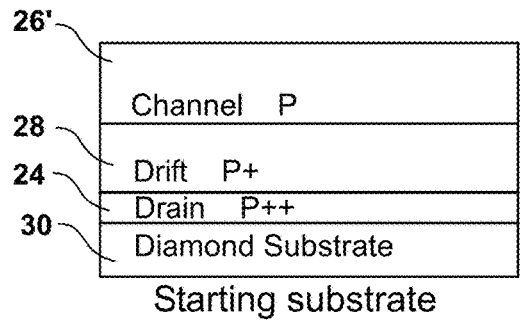
FIGS. 4A to 4K show cross-sectional views of the transistor shown in FIG. 1B during a process for making the transistor, according to an embodiment of this presentation.

FIGS. 4A-4K show a process for making the vertical diamond transistor 12 shown in FIG. 1B, comprising providing a drain region 24 on a diamond substrate 30, which can comprise forming the drain region 24 on the diamond substrate 30. According to an embodiment of this presentation, the process can further comprise providing a drift region 28 on the drain region 24, which can comprise forming the drift region 28 on the drain region 24. According to an embodiment of this presentation, the process can further comprise providing a channel region 26 on the drift region 28, which can comprise forming a channel region on the drift region 28 (FIG. 4A).

Figure 4E:
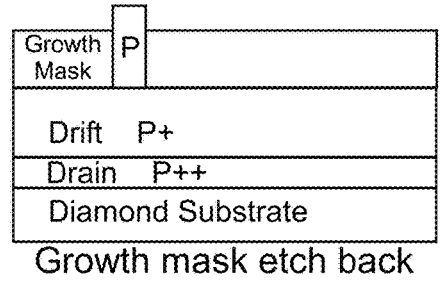
Figure 4B:
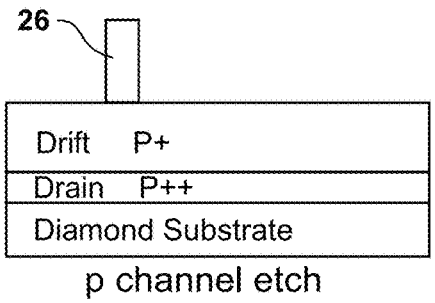

According to an embodiment of this presentation, forming the channel region 26 can comprise providing and/or forming a channel layer 26' on the drift region 28, and removing a portion of the channel layer 26' from the drift region to form the channel region 26, for example, by etching channel layer 26' to expose all of the drift region 28 except the portion of drift region 28 that must be covered by channel region 26 (FIG. 4B). If the portion of the channel layer 26' is etched, the unetched portion of the channel layer 26' can be the channel region 26. According to an embodiment of this presentation, the channel layer 26' can be a p-type channel layer 26' and/or the channel region 26 can be a p-type channel region 26.

According to an embodiment of this presentation, the channel region 26 and/or the channel layer 26' can be formed or grown on the drift region 28 (drift region 28 is optional and is there to increase the breakdown voltage of the transistor) before the making of the transistor 12. In this embodiment, the process can comprise providing the channel region 26 and/or the channel layer 26'. Then, a diamond growth/regrowth process can be performed to form a source region 22 on the channel region 26.

According to an embodiment of this presentation, the drain region 24 can be a drain layer 24 and/or the drift region 28 can be a drift layer 28.

According to an embodiment of this presentation, underneath the channel region 26 and/or the channel layer 26' can be the drift layer 28 and the drain layer 24. The doping in the drain region 24, the drift region 28, and the channel region 26 can vary for certain applications. According to an embodiment of this presentation, the dopant concentration in the channel region 26 doping can be less than $1e18/cm^3$. The dopant concentration in the drift region 28 can be less than $1e19/cm^3$. The drain region 24 can be heavily doped such that the dopant concentration in the drain region 24 can be larger than $1e20/cm^3$.

According to an embodiment of this presentation, the channel region 26 can be formed using lithography and etch processes. According to an embodiment of this presentation the channel region 26 can be formed with a cross-section width. This cross-section width can be determined by the design of the transistor, and in particular can be determined by the transistor gate voltage threshold requirement, for example, through a typical transistor threshold model.

Figure 4F:
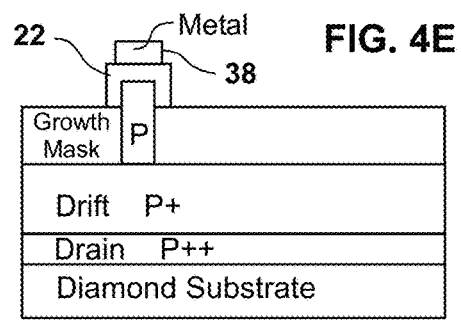
Figure 4C:
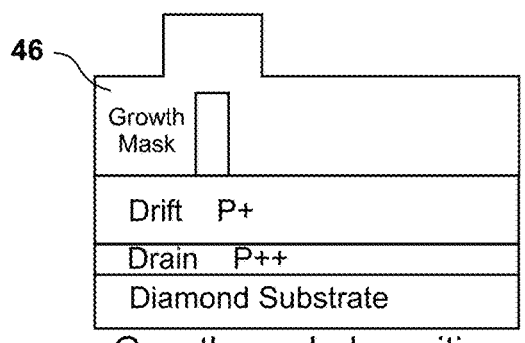
Figure 4G:
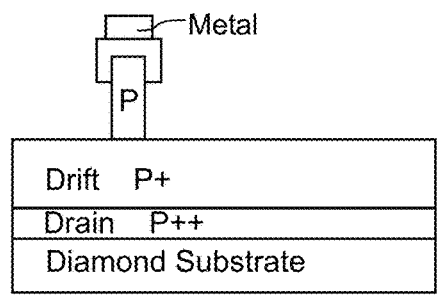
Figure 4D:
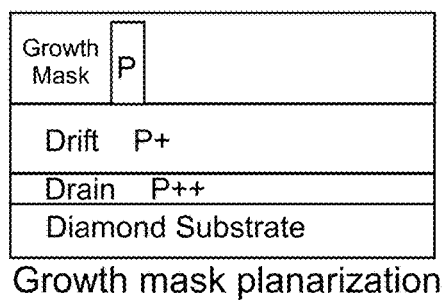

According to an embodiment of this presentation, the process can further comprise forming a mask 46 on the drift region 28 and on the channel region 26 (FIG. 4C). The mask can comprise oxide and/or the mask can be an oxide mask.

According to an embodiment of this presentation, the process can further comprise planarizing the mask to form a planarized surface thereof (FIG. 4D), using for example a chemical mechanical planarization/polishing (CMP) process.

According to an embodiment of this presentation, the process can further comprise removing a portion of the mask 46 from the channel region 26 to expose a top portion of the channel region 26 (FIG. 4E). According to an embodiment of this presentation, removing the portion of the mask 46 can comprise etching the portion of the mask 46.

According to an embodiment of this presentation, the process can further comprise forming the source region 22 on the top portion of the channel region 26 (FIG. 4F). Forming the source region 22 can comprise forming the source region with the mask 46 and on a top portion of the channel region 26 (FIG. 4F).

According to an embodiment of this presentation, forming the channel region 26, the drift region 28, the source region 22, and/or the drain region 24 can comprise depositing the channel region 26, the drift region 28, the source region 22, and/or the drain region 24. According to an embodiment of this presentation, the channel region 26, the drift region 28, the source region 22, and/or the drain region 24, can be deposited via chemical vapor deposition, and for example, microwave plasma enhanced chemical vapor deposition (MWPECVD) of doped diamond. Depositing the channel region 26, the drift region 28, the source region 22, and/or the drain region 24 can comprise depositing diamond concurrently with depositing dopants (e.g., p-type or n-type dopants). Suitable p-type dopants for diamond can include boron. Suitable n-type dopants for diamond can include nitrogen and/or phosphorus.

According to an embodiment of this presentation, the process can further comprise forming a first metal layer on the source region 22. The first metal layer can be formed using a lithography and metallization process.

According to an embodiment of this presentation, the process can further comprise removing the mask 46 from the bottom portion of the channel region 26. Removing the mask 46 can comprise removing the mask so that a sidewall of the channel region 26 is exposed.

Figure 4H:
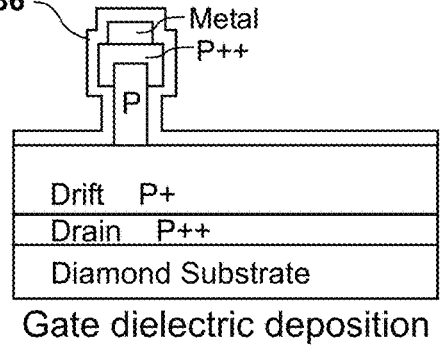

According to an embodiment of this presentation, the process can further comprise forming a dielectric layer 36 on the channel region 26 (FIG. 4H). Forming the dielectric layer 36 can comprise forming the dielectric layer on the sidewall of the channel region 26. The dielectric layer 36 can be a conformal dielectric layer 36. The dielectric layer 36 can be deposited using a conformal deposition process.

According to an embodiment of this presentation, the process can also comprise forming the dielectric layer 36 on the source region 22 and on the drift region 28.

Figure 4I:
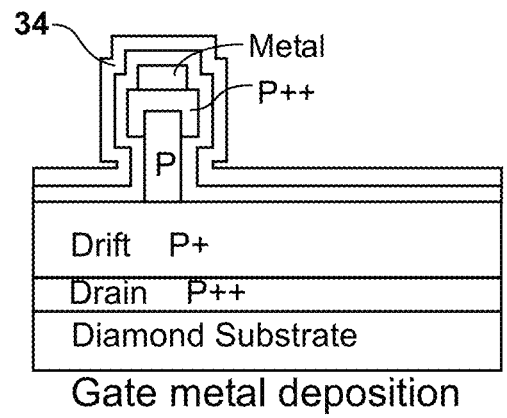

According to an embodiment of this presentation, the process can further comprise forming a conductive gate layer or gate electrode 34 on the dielectric layer 36 (FIG. 4I). Forming the gate electrode 34 can comprise forming the gate electrode 34 on a portion of the dielectric layer 36 that was formed on the channel region 26. The gate electrode 34 can be deposited using a conformal deposition process.

According to an embodiment of this presentation, forming the gate electrode 34 can comprise forming the gate electrode 34 on portions of the dielectric layer 36 that were formed on the source region 22 and on the drift region 28.

Figure 4J:
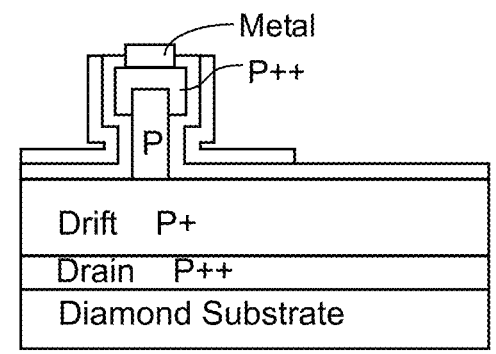
Figure 4K:
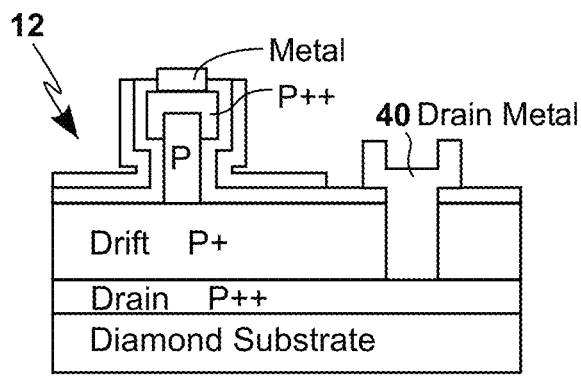

According to an embodiment of this presentation, the process can further comprise removing a portion of the gate electrode 34 from the source region 22 and/or the drift region 28 (FIG. 4J). According to an embodiment of this presentation, removing the portion of the gate electrode 34 can comprise removing the portion of the gate electrode 34 to expose the first metal layer 38. The conductive gate layer (e.g. a gate metal) is patterned so that the source metal 38 is exposed. According to an embodiment of this presentation, the process can further comprise forming a second metal layer/contact 40 on the drain region 24 (FIG. 4K) The same considerations apply to the forming of the drain contact for this embodiment and for the embodiments previously detailed.

According to an embodiment of this presentation, the process can further comprise forming an array of transistors 12.

The vertical diamond transistor can be a MOSFET enabled by a regrowth process.

FIG. 5 shows a cross-sectional view of a vertical diamond transistor 14, demonstrating the feasibility of a vertical diamond MOSFET, which can be the same as the transistor 12 shown in FIG. 1B except that the source region 22 does not wrap around the top portion of the channel region 26 (i.e. does not extend downward along vertical sides of the top portion of the channel region 26), whereby the source region 22 is not wider than the channel region 26. Also, the channel in a transistor such as illustrated in FIG. 5 can be etched out of a diamond substrate. By not wrapping the source region 22 around the top portion of the channel region 26, the contact resistance between the first metal layer 38 and the source region 22 and/or the contact resistance between the source region 22 and the channel region 26 can be higher than the corresponding contact resistances of a transistor as shown in FIG. 1B of otherwise similar dimensions.

FIGS. 6A-6E show images of an actual reduction to practice of a vertical diamond transistor, such as the transistor 14 illustrated in FIG. 5. FIG. 6A shows an elevation view of two transistors 14 having source contact pads on the left and right corners of the picture, respectively, having a drain contact pad on the top center of the picture and having a gate contact pad on the bottom center of the picture. The gate contact pad is electrically connected to gate metal strips running along series of channel ridges (center of the picture). FIG. 6B shows an elevation view of an end of a channel ridge of a transistor 14 such as detailed in FIG. 5, after a source region was formed by doping on top of the ridge but before a gate metal has been formed along the ridge.

FIG. 6C shows an elevation view of two channel ridges of a transistor 14 after a source metal layer was formed on top of the ridges and after a gate metal has been formed along the ridges. On the bottom of the pictures can be seen the gate metal layer electrically connecting the gate metal strips running along the channel ridges.

FIG. 6D shows an elevation view of one channel ridge of a transistor 14 after a source connection metal layer was formed on top of a structure such as illustrated in FIG. 6C (passivated so as to not short-circuit the gate metal layer).

FIG. 6E is identical to FIG. 6A.

Figure 7:
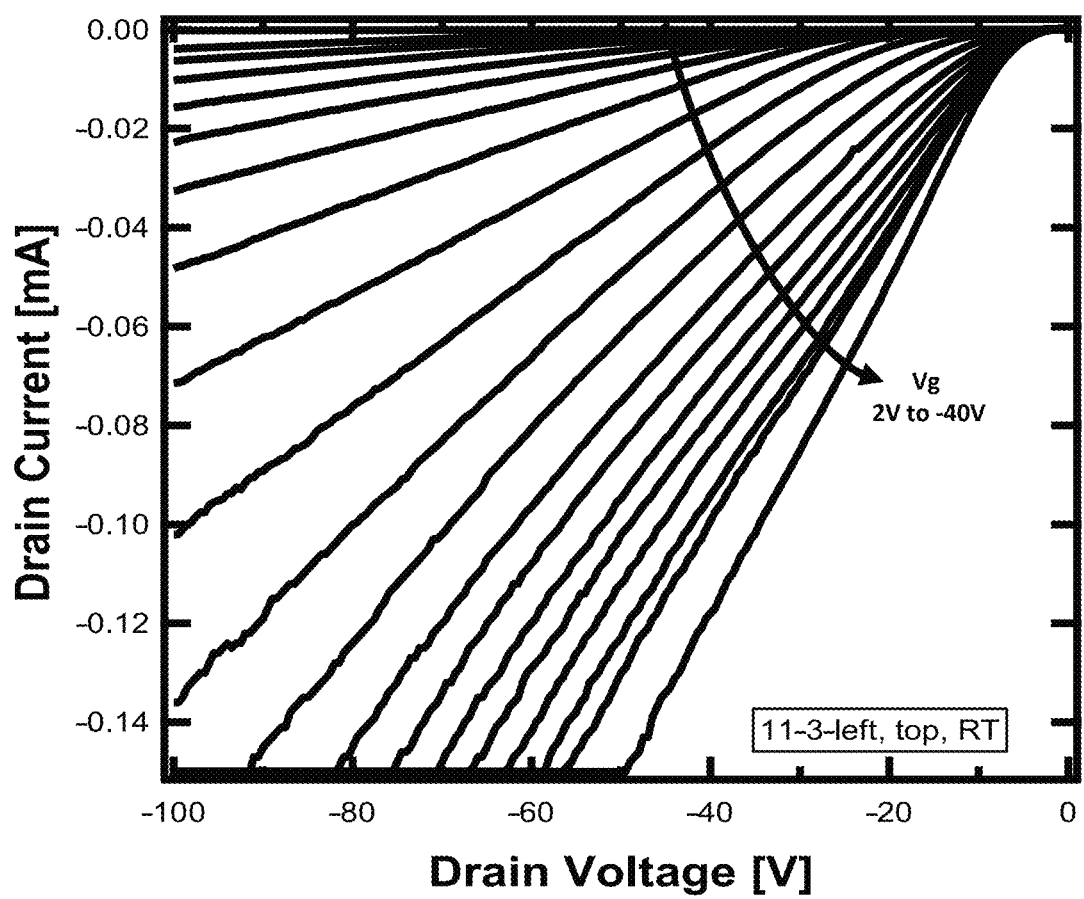
FIG. 7 graphically shows the transfer characteristic of a transistor as in FIG. 5 as the gate voltage varies.

FIG. 7 graphically illustrates the transfer characteristic of a transistor operated at room temperature, such as transistor 14 when the gate voltage changes from +2 volts to −40 volts. When the gate voltage is less than 2V, the transistor is turned on. When the gate voltage is 2V or larger, the transistor is turned off. Therefore, the transistor can have a pinch off voltage of about 2V, according to an embodiment of this presentation. While it is shown in FIG. 7 that 100V can be applied to the drain during operation, more than 1 kV can be applied to the drain metal layer 40, according to an embodiment of this presentation. This is because, for example, bulk single crystalline (e.g. p-type) diamond can have a breakdown field of greater than 2MV/cm, which can be suitable for a transistor operating as a high voltage switch (>1 kV). A vertical diamond transistor having a channel region 26 length greater than 1 µm can enable high power operation at operating frequencies of 1 to 10 GHz, according to an embodiment of this presentation. The vertical diamond transistor 14 can pave the path to high power electronics.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

As outlined above, a transistor according to embodiments of this presentation can operate either as a "normally off" or "normally on" transistor, depending on its design. The diameter or the second width 66 of the channel region 26 and a thickness of the gate dielectric 36 can determine if the transistor is normally on or off.

The transistor can be a junction FET, according to an embodiment of this presentation. During operation, hole carriers can distribute through the whole channel region 26. When the transistor is operated in the accumulation regime, a hole gas can form on the interface between the channel region 26 and the gate dielectric 36.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this presentation with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this presentation is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

The invention claimed is:

1. A vertical field-effect transistor (FET), comprising:
a first doped region of a first material, said first doped region having a first doping and being formed on a surface of a substrate; a drain metal layer connected with a portion of the first doped region;
a second doped region of said first material, said second doped region having a second doping and being formed on the first doped region, said second doped region having a top surface as well as at least one side wall;
a third doped region of said first material, said third doped region having a third doping and being formed on said top surface of the second doped region as well as on at least a portion of said at least one side wall of said second doped region; a source metal layer connected with the third doped region; and
a fourth doped region of said first material, having a fourth doping and formed between the first and second doped regions; wherein:
the first doped region has a first width along a first direction parallel to said surface of the substrate;
the second doped region has a second width along said first direction;
the third doped region has a third width along said first direction;
the second width being smaller than the first and third widths;
the first doped region, the second doped region, and the third doped region being of a first conductivity type.

2. The vertical FET of claim 1, wherein each of the drain metal layer and the source metal layer has, in said first direction, a width larger than the second width.

3. The vertical FET of claim 1, wherein said portion of said at least one side wall of said second doped region is a top portion of said at least one side wall of said second doped region, and wherein a gate dielectric covers a bottom portion of said at least one side wall of said second doped region.

4. The vertical FET of claim 3, wherein a gate electrode covers at least a portion of said gate dielectric along said bottom portion of said at least one side wall of said second doped region.

5. The vertical FET of claim 1, wherein said substrate is made out of said first material.

6. The vertical FET of claim 1, wherein said first doping has a concentration larger than said second doping; the third doping having a concentration larger than said second doping.

7. The vertical FET of claim 1, wherein said first material comprises diamond.

8. The vertical FET of claim 7, wherein said first, second and third dopings are p-type doping.

9. The vertical FET of claim 7, wherein said first, second, and third dopings are n-type doping.

10. A vertical field-effect transistor (FET), comprising:
a first doped region of a first material, said first doped region having a first doping and being formed on a substrate; a drain metal layer connected with a portion of the first doped region;
a second doped region of said first material, said second doped region having a second doping and being formed on the first doped region, said second doped region having a top surface as well as at least one side wall;
a third doped region of said first material, said third doped region having a third doping and being formed on said top surface of the second doped region as well as on at least a portion of said at least one side wall of said second doped region, thereby forming a contact surface between said second doped region and said third doped region; a source metal layer connected with the third doped region;
a fourth doped region of said first material, having a fourth doping and formed between the first and second doped regions; wherein:
the first doped region has a first width along a first direction parallel to said top surface of said second doped region;
the second doped region has a second width along said first direction;
the third doped region has a third width along said first direction;
the second width being smaller than the first and third widths;
the first doped region, the second doped region, and the third doped region being of a first conductivity type.

11. A vertical field-effect transistor (FET), comprising:
a first doped region of a first material, said first doped region having a first doping and being formed on a substrate;
a second doped region of said first material, said second doped region having a second doping and being formed on the first doped region, thereby forming a first contact area between said first doped region and said second doped region, said second doped region having a top surface as well as at least one side wall; and
a third doped region of said first material, said third doped region having a third doping and being formed on said top surface of said second doped region as well as on at least a portion of said at least one side wall of said second doped region, thereby forming a second contact area between said second doped region and said third doped region; wherein
the second contact area is larger than the first contact area;
the first doped region, the second doped region, and the third doped region being of a first conductivity type;
the first doped region comprises a fourth doped region and a fifth doped region;
the fourth doped region having a fourth doping and being formed on said substrate;
said fifth doped region having a fifth doping and being formed on said fourth doped region, thereby forming a third contact area between said fourth doped region and said fifth doped region;
said first contact area is formed between said fifth doped region and said second doped region; and
said third contact area is larger than said first contact area.

12. A method of making a vertical field-effect transistor (FET), comprising:
providing a first doped region of a first material, said first doped region having a first doping and being formed on a surface of a substrate; a drain metal layer being connected with a portion of the first doped region;
providing a second doped region of said first material, said second doped region having a second doping and being formed on the first doped region, said second doped region having a top surface as well as at least one side wall;

providing a third doped region of said first material, said third doped region having a third doping and being formed on said top surface of said second doped region as well as on at least a portion of said at least one side wall of said second doped region; a source metal layer being connected with the third doped region; and
providing a fourth doped region of said first material, having a fourth doping and formed between the first and second doped regions; wherein:
the first doped region has a first width along a first direction parallel to said surface of the substrate;
the second doped region has a second width along said first direction;
the third doped region has a third width along said first direction;
the second width being smaller than the first and third widths;
the first doped region, the second doped region, and the third doped region being of a first conductivity type.

13. The method of claim 12, further comprising:
providing a drain metal layer in contact with a portion of the first doped region; and
providing a source metal layer in contact with the third doped region, wherein each of the drain metal layer and the source metal layer has, in said first direction, a width larger than the second width.

14. The method of claim 12, wherein said portion of said at least one side wall of said second doped region is a top portion of said at least one side wall of said second doped region; the method further comprising covering a bottom portion of said at least one side wall of the second doped region with a gate dielectric and covering at least a portion of said gate dielectric with a gate electrode.

15. The method of claim 12, wherein said substrate is made out of said first material.

16. The method of claim 12, wherein said first doping has a concentration larger than said second doping; the third doping having a concentration larger than said second doping.

17. The method of claim 12, wherein said first material comprises diamond.

18. A vertical field-effect transistor (FET), comprising:
a first doped region of a first material, said first doped region having a first doping and being formed on a surface of a substrate; a drain metal layer connected with a portion of the first doped region;
a second doped region of said first material, said second doped region having a second doping and being formed on the first doped region, said second doped region having a top surface as well as at least one side wall;
a third doped region of said first material, said third doped region having a third doping and being formed on said top surface of the second doped region as well as on at least a portion of said at least one side wall of said second doped region; a source metal layer connected with the third doped region;
a fourth doped region of said first material, having a fourth doping and formed between the first and second doped regions; wherein:
the first doped region has a first width along a first direction parallel to said surface of the substrate;
the second doped region has a second width along said first direction;
the third doped region has a third width along said first direction; and
the second width being smaller than the first and third widths.

19. The transistor of claim 1, wherein:
the first doped region is a drain region;
the second doped region is a channel region; and
the third doped region is a source region.

20. The transistor of claim 10, wherein:
the first doped region is a drain region;
the second doped region is a channel region; and
the third doped region is a source region.

21. The transistor of claim 11, wherein:
the first doped region is a drain region;
the second doped region is a channel region; and
the third doped region is a source region.

22. A vertical field-effect transistor (FET), comprising:
a first doped region of a first material, said first doped region having a first doping and being formed on a surface of a substrate;
a second doped region of said first material, said second doped region having a second doping and being formed on the first doped region, said second doped region having a top surface as well as at least one side wall;
a third doped region of said first material, said third doped region having a third doping and being formed on said top surface of the second doped region as well as on at least a portion of said at least one side wall of said second doped region; and
a fourth doped region of said first material, having a fourth doping and formed between the first and second doped regions; wherein:
the first doped region has a first width along a first direction parallel to said surface of the substrate;
the second doped region has a second width along said first direction;
the third doped region has a third width along said first direction;
the second width being smaller than the first and third widths;
the first doped region, the second doped region, and the third doped region being of a first conductivity type, wherein:
the second doped region has a top portion and a bottom portion,
said bottom portion of said second doped region is formed on the first doped region,
said top surface of said second doped region is a top surface of said top portion of said second doped region,
said at least one side wall of said second doped region is at least one side wall of said top portion of said second doped region,
said second width is a width of said bottom portion of said second doped region along said first direction;
said top portion of said second doped region has a fourth width along said first direction, and
said second width being smaller than the fourth width.

23. A vertical field-effect transistor (FET), comprising:
a first doped region of a first material, said first doped region having a first doping and being formed on a surface of a substrate; a source metal layer connected with a portion of the first doped region;
a second doped region of said first material, said second doped region having a second doping and being formed on the first doped region, said second doped region having a top surface as well as at least one side wall;
a third doped region of said first material, said third doped region having a third doping and being formed on said top surface of the second doped region as well as on at least a portion of said at least one side wall of said second doped region; a drain metal layer connected with the third doped region; and a fourth doped region of said first material, having a fourth doping and formed between the first and second doped regions; wherein:

the first doped region has a first width along a first direction parallel to said surface of the substrate;

the second doped region has a second width along said first direction;

the third doped region has a third width along said first direction;

the second width being smaller than the first and third widths;

the first doped region, the second doped region, and the third doped region being of a first conductivity type.

\* \* \* \* \*